(12) United States Patent
Arndt

(10) Patent No.: US 7,746,616 B2
(45) Date of Patent: Jun. 29, 2010

(54) PROTECTION CIRCUIT AND METHOD OF PROTECTING A LOAD CIRCUIT

(75) Inventor: Christian Arndt, Munich (DE)

(73) Assignee: Infineon Technologies AG, Munich (DE)

( * ) Notice: Subject to any disclaimer, the term of this patent is extended or adjusted under 35 U.S.C. 154(b) by 722 days.

(21) Appl. No.: 11/536,464

(22) Filed: Sep. 28, 2006

(65) Prior Publication Data

US 2007/0076342 A1 Apr. 5, 2007

(30) Foreign Application Priority Data

Sep. 30, 2005 (DE) .................... 10 2005 046 979

(51) Int. Cl.
- *H02H 3/08* (2006.01)
- *H02H 5/04* (2006.01)
- *H02H 9/02* (2006.01)

(52) U.S. Cl. .................. 361/103; 361/93.1; 361/93.7; 361/93.8

(58) Field of Classification Search ................ 361/103, 361/93.1, 83.2, 93.7, 93.8

See application file for complete search history.

(56) References Cited

U.S. PATENT DOCUMENTS 6,441,679 B1 * 8/2002 Ohshima .................... 327/538

FOREIGN PATENT DOCUMENTS

| DE | 195 27 997 | * | 7/1995 |
| DE | 19744765 A1 | | 10/1997 |
| JP | 2002135098 | * | 5/2002 |

* cited by examiner

*Primary Examiner*—Stephen W Jackson
*Assistant Examiner*—Zeev Kitov
(74) *Attorney, Agent, or Firm*—Eschweiler & Associates, LLC

(57) ABSTRACT

A protection circuit includes an interruption device formed to interrupt a current path between a protection circuit input and a protection circuit output upon exceeding a predetermined temperature at a temperature measurement location, and a control device formed to generate a control signal depending on a current in the current path, wherein the protection circuit is formed to increase the temperature at the temperature measurement location or decrease the predetermined temperature, when the control signal indicates that the current in the current path is higher than a threshold value current.

22 Claims, 6 Drawing Sheets

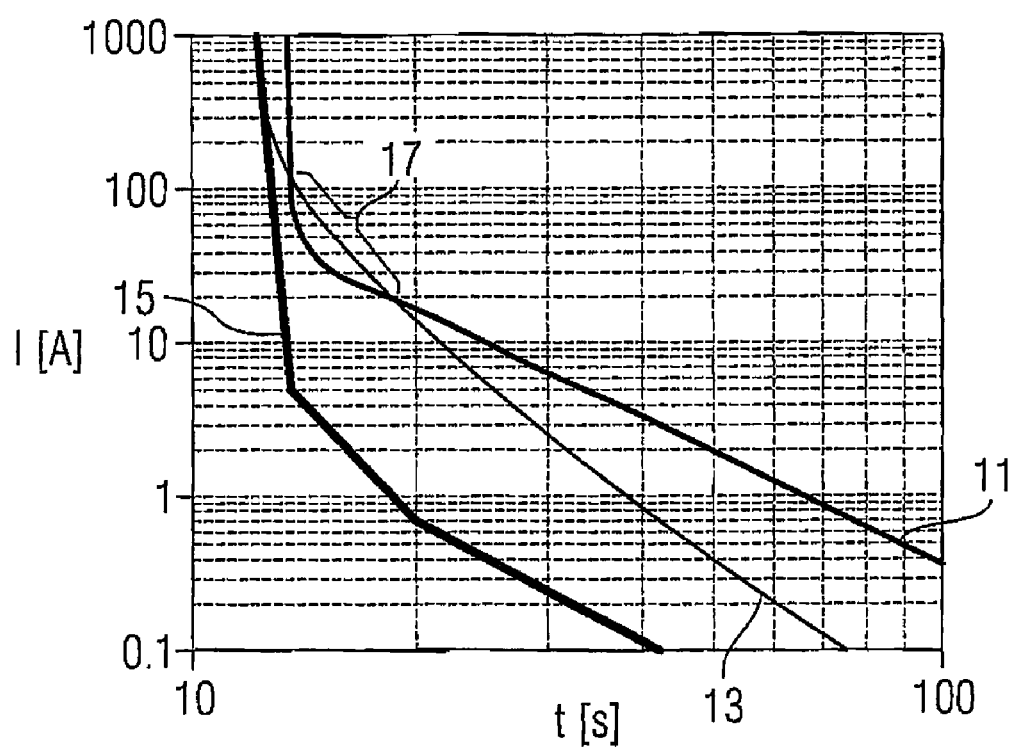

PROTECTION CIRCUIT AND METHOD OF PROTECTING A LOAD CIRCUIT

CROSS-REFERENCE TO RELATED APPLICATIONS

This application claims priority from German Patent Application No. DE 10 2005 046 979.5, which was filed on Sep. 30, 2005, and is incorporated herein by reference in its entirety.

TECHNICAL FIELD

The present invention relates to a protection circuit and a method of protecting a load circuit.

BACKGROUND

Protected or protecting semiconductor switches are increasingly employed to protect downstream components, such as traces on circuit boards or PCB (printed circuit board) traces or cables, and thus to take over a protection function. Complete employment or employment of all protection elements in a protection circuit for downstream components by semiconductor switches is, however, problematic particularly in an overload case due to the increased response times, as will still be explained later.

So as to adapt the response time of a conventional semiconductor switch, so-called smart semiconductor switches, which enable adjusting a load current threshold leading to immediate switch-off via a current sense function, are employed for protection, for example. These conventional semiconductor switches, for example, are made by the company International Rectifier offering a smart semiconductor switch or smart high-side switch IR 3310 in its portfolio. Moreover, conventional semiconductor switches supporting software-side programming of a load current threshold and a fading time, such as the products MC33982 or MC33984, are offered by the company Freescale within the scope of its Extreme Switch family.

In the conventional semiconductor switches, in which an overload current threshold is adjusted during operation, or an overload current threshold fixed prior to startup, it is disadvantageous that the semiconductor switches lose their conductivity when the load current exceeds the load current threshold.

Moreover, semiconductor switches in which overtemperature protection is implemented are offered, these semiconductor switches interrupting a current through a downstream component, such as a cable, when its temperature exceeds a certain temperature threshold. Due to the great thermal capacity of a package of a protecting semiconductor switch and the thermal capacities resulting from the arrangement of the package of the semiconductor switch on the PCB, a response of the protecting semiconductor switch is substantially more inert than that of a comparable protection, particularly in an overload case. By an overload case, a state in which a voltage greater than a nominal voltage for which the components of the circuit are designed is applied to a circuit, or a current greater than a nominal current for which the components of the circuit are designed flows into the circuit is understood.

Particularly in an overload case, when the load current is only slightly greater than the nominal current, a more inert response of the protecting semiconductor switch than that of the cable to be protected may occur.

In FIG. 8, response times for two protection elements and one cable are shown. The current flowing through a protecting element or a cable is plotted on the x-axis in amperes, whereas the response time is plotted on the y-axis in seconds. After the response time, the protection elements inhibit current flow through the protection element, or the cable will become destroyed.

Curve 11 shows a course of a response time of a cable in dependence on a current through the cable at a temperature of 85° C. Curve 13 explains a course of a response time of a semiconductor switch, here of the BTS6143 type, at a temperature of 85° C. in dependence on a current through the semiconductor switch, whereas curve 15 shows a course of a response time of a protection in dependence on a current through the protection. Here, the protection is a mini-fuse designed for 10 amperes. It can be seen from FIG. 8 that the response time of the conventional semiconductor switch is higher than the response time of the cable in a critical region 17. This leads to the fact that the cable becomes destroyed before the conventional semiconductor switch inhibits the current through the cable downstream thereto. Thus, the cable is not reliably protected by the semiconductor switch over the entire range of the current values illustrated in FIG. 8.

SUMMARY

According to an embodiment, a protection circuit may have: an interrupter formed to interrupt a current path between a protection circuit input and a protection circuit output upon exceeding a predetermined temperature at a temperature measurement location; and a controller formed to generate a control signal depending on a current in the current path, wherein the protection circuit is formed to increase the temperature at the temperature measurement location or decrease the predetermined temperature, when the control signal indicates that the current in the current path is higher than a threshold value current.

BRIEF DESCRIPTION OF THE DRAWINGS

These and other objects and features of the present invention will become clear from the following description taken in conjunction with the accompanying drawings, in which:

FIG. 8 is a comparison of response times of a conventional semiconductor switch, of a cable, and of a protection element.

DETAILED DESCRIPTION

Figure 1:
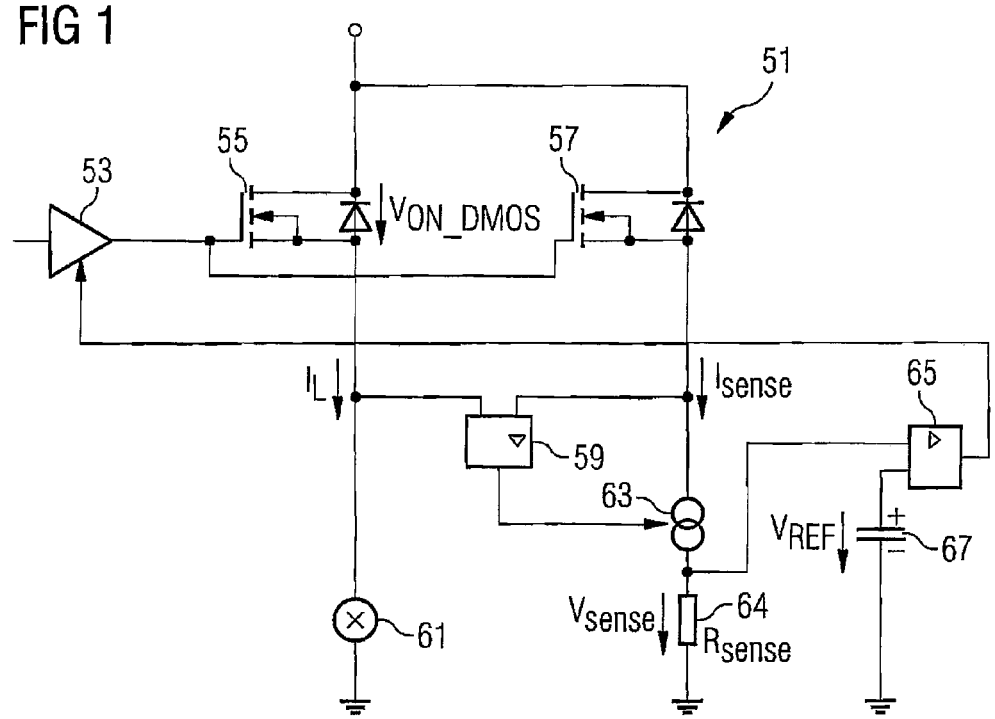
FIG. 1 shows a protection circuit according to an embodiment of the present invention.

According to another embodiment, a method of protecting a load circuit may comprise: measuring a temperature of the load circuit at a temperature measurement location; measuring a current through the load circuit; increasing the temperature at the temperature measurement location or decreasing a predetermined temperature value, when the current through the load circuit exceeds a threshold current value; and interrupting a current through the load circuit when the temperature at the temperature measurement location exceeds the predetermined temperature value.

According to a further embodiment a protection circuit may have an interruption means formed to interrupt a current path between a protection circuit input and a protection circuit output upon exceeding a predetermined temperature at a temperature measurement location, and a control means formed to generate a control signal in dependence on a current in the current path, wherein the protection circuit is formed to increase the temperature at the temperature measurement location or decrease the predetermined temperature, when the control signal indicates that the current in the current path is higher than a threshold value current.

According to yet another embodiment, a method of protecting a load circuit, may comprise measuring a temperature of the load circuit at a temperature measurement location, measuring a current through the load circuit, increasing the temperature at the temperature measurement location or decreasing a predetermined temperature, when the current through the load circuit exceeds a threshold current value, and interrupting a current through the load circuit when the temperature at the temperature measurement location exceeds the predetermined temperature.

The present invention is based on the finding that in a protection circuit, when the current in a current path through the protection circuit exceeds a predetermined threshold value current, a temperature at a temperature measurement location can be increased, or a predetermined temperature value above which the interruption means interrupts the current path through the protection circuit can be decreased. Thus, a response time of a protection circuit can be reduced, when the current in the current path exceeds a predetermined threshold value current.

Due to the shorter response times above a threshold value current, protection circuits enabling more reliable protection of downstream components than the conventional semiconductor switches can be produced. Hereby, the operating costs and maintenance costs for devices in which the protection circuits according to an embodiment are employed can be reduced. After all, probability of a failure of a downstream component protected by the protection circuit is reduced due to the shorter response time of the protection circuit according to an embodiment.

Moreover, a protection circuit according to an embodiment is still conductive above a current threshold value, so that operation of downstream components is still possible, if maybe with reduced functionality, also when the current in the current path exceeds a threshold value current. This enables more flexible employment of the protection circuit according to an embodiment.

The present invention enables to provide semiconductor switches having a fixed or adjustable overload current threshold, which still show conducting behavior, but changed in the electrical parameters with reference to the transmission behavior. A protection circuit according to an embodiment provides for an optionally adjustable response of the protecting semiconductor switch in an overload case, but quicker with rising current through the current path, by an optionally programmable, changed, but still conducting behavior of a temperature-protected semiconductor.

Thus, protection circuits according to an embodiment with a smart semiconductor switch can be provided, which enable programming of overload thresholds. When exceeding the programmed overload current threshold, then a substantially quicker response of the protecting semiconductor switch occurs. Thus, gaps in the protection function occurring in conventional semiconductor switches in an overload case may be closed, and components to be protected may be protected more reliably from destruction.

By the employment of a protection circuit according to an embodiment, the switchability e.g. of loads with a switch-on current higher than the nominal current or the overload current threshold thus is possible. The current sensing of the nominal load current may continue taking place via a sense pin in an embodiment, without the sensing or the resolution in the measurement of the current being reduced.

The protection circuit according to an embodiment may employ the current sense principle. In the current sense principle, a current in a sense path proportional to a current in a current path through the load is determined. The current-measuring device determining the current in the sense path does not have to be formed for the maximally occurring current through the load, but only for the maximally occurring current in the sense path. The current in the sense path may be significantly lower than the current through the load.

The overload current threshold may then be adjusted via the value of the sense resistor in the sense path. The sense resistance, and hence the overload current threshold, may be fixed via an external programming or adjusting an internal fixed value, e.g. during the production. In a protection circuit according to an embodiment, the resistance of the protecting semiconductor switch could be increased in arbitrary manner when the load current exceeds the fixed load current threshold or overload current threshold. The voltage drop at the semiconductor switch in a protection circuit according to an embodiment could also be increased when the load current exceeds the overload current threshold.

Here, the losses or the power at the semiconductor switch each increase. In both cases, this leads to a heating of the semiconductor switch in the protection circuit according to an embodiment. Thus, a quicker response of the overtemperature protection or protection circuit according to an embodiment is generated, which is synonymous with a rapid response of the protection characteristic curve in the overload case. At further heating as result of a current increase through the semiconductor switch, the protection circuit according to an embodiment responds more quickly than the conventional semiconductor switch.

As an alternative thereto, the temperature threshold of the temperature-protected semiconductor switch, above which the semiconductor switch interrupts the current path in the protection circuit according to an embodiment, may also be reduced in a defined dividing ratio to the ambient temperature, when the load current in the protection circuit exceeds the load current threshold. To this end, a measurement of the ambient temperature is required. Thus, the protection circuit according to an embodiment has higher flexibility than the conventional semiconductor switch.

In FIG. 1, a protection circuit 51 according to an embodiment is shown. The protection circuit 51 comprises an adjusting circuit 53 for a gate potential, a DMOS switching transistor 55, a sense transistor 57, a comparison circuit 59, a load 61, a constant current source 63, a sense resistor 64, a comparison means 65, and a reference voltage source 67.

The adjusting circuit 53 receives a signal from a temperature-sensing element not shown here and a signal from the comparison means 65. An output of the adjusting circuit 53 for the gate potential is connected to a gate terminal of the DMOS switching transistor 55 and a gate terminal of the sense transistor 57. In the transistors 55, 57, a bulk terminal and a drain terminal each are shorted. A reverse-biased diode each is connected between a drain terminal and a source terminal in the transistors 55, 57.

The drain terminal of the DMOS switching transistor 55 is attached to a ground terminal via the load 61 and at the same time connected to a first input of the comparison circuit 59. The drain terminal of the sense transistor 57 is connected to a second input of the comparison circuit 59 and a first terminal of the constant current source 63 in electrically conducting manner. A second terminal of the constant current source 63 is coupled to a ground terminal via the sense resistor 64. An output of the comparison circuit 59 generates a signal depending on which a current is adjusted by the constant current source 63. The second terminal of the constant current source 63 is connected to a first input of the comparison means 65. A second input of the comparison means 65 is connected to a plus pole of the reference voltage source 67, whereas a minus pole of the reference voltage source 67 is attached at a ground terminal. The source terminals of the DMOS switching transistor 55 and of the sense transistor 57 are attached to a supply voltage terminal.

The adjusting circuit 53 senses a temperature at the DMOS switching transistor 55 via the temperature-sensing element not shown here. When the temperature at the DMOS switching transistor 55 exceeds a predetermined threshold value, the adjusting circuit 53 reduces the potential at the gate terminal of the DMOS switching transistor 55 and of the sense transistor 57. Thus, the two enhancement transistors or field-effect transistors 55, 57 block, and the switching transistor 55 interrupts the connection between the supply voltage terminal and the load 61 or a current path between an input terminal and an output terminal of the protection circuit 51 according to an embodiment. As already explained, the diodes at the transistor 55, 57 are reverse-biased and serve to avoid, upon occurrence of voltage peaks each between the drain terminal and the source terminal of the transistors 55, 57, destruction of the transistors by these voltage peaks.

The comparison circuit 59 serves to compare a current through the sense resistor 64 and through the load 61 with each other. If the currents through the sense resistor 64 and through the load 61 are not at a predefined ratio to each other, the comparison circuit 59 generates a signal at its output and regulates the constant current source 63 so that the currents through the sense resistor 64 and through the load 61 are at the predetermined ratio to each other.

The comparison means 65 compares a voltage drop $V_{sense}$ at the sense resistor 64 with a voltage at the reference voltage source 67 and generates a signal at the output of the comparison means 65, which signal depends on a difference between the voltage drop $V_{sense}$ at the sense resistor 64 and the voltage $V_{REF}$ of the reference voltage source 67. Depending on the signal at the output of the comparison means 65, the adjusting circuit regulates the potential at the gate terminals of the transistors 55, 57.

When the voltage drop $V_{sense}$ at the sense resistor 64, which is proportional to the load current $I_L$, exceeds a predetermined threshold value, the comparison means 65 thus generates a signal leading to the adjusting circuit 53 increasing the resistance between the source terminal and the drain terminal of the DMOS switching transistor 55. This increase in resistance of the DMOS switching transistor 55 leads to the fact that the load current flowing through the DMOS switching transistor causes greater heating of the DMOS switching transistor 55. This greater heating is registered by the temperature-sensing element not shown here. The arising temperature then is closer to a critical temperature threshold, above which the adjusting circuit 53 interrupts the current flow through the DMOS switching transistor 55.

Thus, when the current $I_L$ through the load exceeds a predetermined threshold value, the protection circuit 51 has higher sensitivity due to the developing increased resistance between the source terminal and the drain terminal of the DMOS switching transistor 55. This higher sensitivity is a concomitant of a shortened response time of the protection switch 51. Due to the artificially generated, raised temperature at the switching transistor 51, and hence at the temperature sensor or temperature-sensing element, the protection circuit 51 responds within a shorter time or a shorter reaction time, e.g. upon occurrence of a current peak. Possible current peaks through the DMOS switching transistor 55 lead to further increase in temperature at the DMOS switching transistor 55, which may lead to an interruption of the current path via the DMOS switching transistor 55.

Via the current at a current sense pin or the voltage drop $V_{sense}$ at the sense resistor 64 and the value of the voltage of the reference voltage source 67, exceeding the overload current threshold by the load current $I_L$ can be detected. The overload current threshold may here be adjusted via the value of the sense resistor 64 and the value of the voltage of the reference voltage source 67.

The voltage drop $V_{sense}$ at the sense resistor 64 here is determined via the current $I_{sense}$ and the value $R_{sense}$ of the sense resistor 64 according to the formula $V_{sense}=R_{sense}*I_{sense}$. When the voltage drop $V_{sense}$ exceeds the value of the internal reference voltage $V_{REF}$, wherein then the connection $V_{sense}>V_{REF}$ applies, the resistance of the power transistor or the DMOS switching transistor 55 is increased via an internal comparator or an internal operational amplifier in the comparison means 65 and the adjusting circuit 63, for example. This increase leads to an increase in temperature of the switching transistor 55 and to increased sensitivity, as already explained.

The protection circuit 51 according to an embodiment then permits quicker response of the protecting semiconductor switch or switching transistor 55 as opposed to protecting load elements, such as cables or PCB traces. By adjusting the voltage value $V_{REF}$ of the reference voltage source or the value $R_{sense}$ of the sense resistor 64, for example, adjusting the overload current threshold by a user is made possible. Thus, the semiconductor switch 55, which is arranged in the protection circuit according to an embodiment, is capable of taking over the function of a switch and of a protection in better and more flexible manner than the conventional smart semiconductor switches.

Figure 2A:
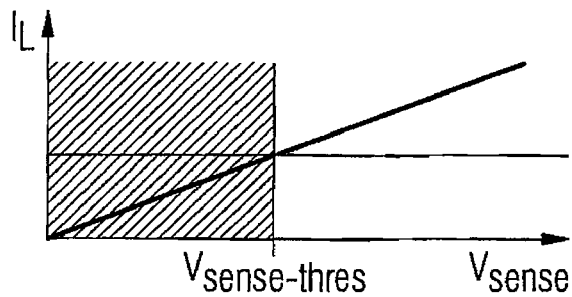
FIG. 2a shows a course of a load current in the protection circuit according to an embodiment of the present invention.

FIG. 2a shows a connection between the voltage at the sense resistor 64 and the load current $I_L$ or current through the load 61. In FIG. 2a, a value of the voltage $V_{sense}$ at the sense resistor 64 is plotted on the x-axis, and a value of the load current $I_L$ on the y-axis. The voltage $V_{sense}$ at the sense resistor 64 increases linearly with the load current $I_L$. Above a threshold value of the voltage at the sense resistor 64, $V_{sense\_thres}$, the protection circuit 51 is operated in an overload mode, and is operated in a normal operation mode below the threshold. In FIGS. 2a-d, the operating conditions for the normal operation mode are illustrated by a gray hatched field and for the overload mode by a white field.

Figure 2B:
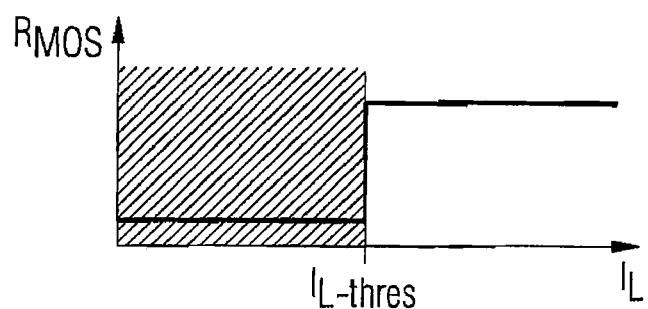
FIG. 2b shows an optional course of a resistance of a DMOS transistor in the embodiment shown in FIG. 1.

FIG. 2b shows a course of a resistance of the DMOS switching transistor 55 in dependence on the load current $I_L$ in the protection circuit 51. The value of the load current $I_L$ is plotted on the x-axis, whereas the value of the resistance of the transistor $R_{MOS}$ or switching transistor 55 is plotted on the y-axis. When the comparison means 65 recognizes that the load current $I_L$ exceeds a threshold value, it generates such a signal at its output that the adjusting circuit 53 regulates the gate potential so that the resistance $R_{MOS}$ of the switching transistor 55 is increased or the resistance between the source terminal and the drain terminal is increased. The increase takes place suddenly, as it is shown in FIG. 2b.

Here, the resistance $R_{MOS}$ of the transistor 55 increases by a defined value. The comparison means 65 may for example comprise a comparator correspondingly adjusting the signal at the output of the comparison means 65 when a certain threshold of the voltage $V_{sense}$ at the sense resistor 64 is exceeded.

Figure 2C:
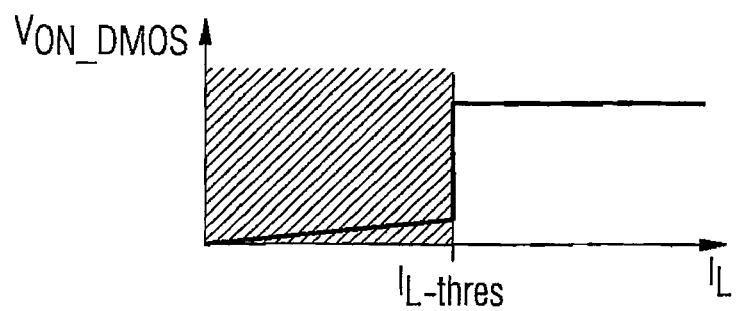
FIGS. 2c-d show optional courses of the voltage at the DMOS transistor in the protection circuit according to an embodiment of the present invention shown in FIG. 1.

As an alternative hereto, as it is shown in FIG. 2c, the adjusting circuit 53 can change the voltage $V_{ON\_DMOS}$ present between the source terminal and the drain terminal of the transistor 55. In FIG. 2c, this course is shown. A value of the load current $I_L$ is plotted on the x-axis in FIG. 2c, whereas a value of the voltage between the source terminal and the drain terminal is plotted on the y-axis.

When the load current $I_L$ exceeds the threshold value $I_{L\_thres}$, the adjusting circuit 53 adjusts the voltage across the semiconductor switch 55 or between the source terminal and the drain terminal of the transistor 55 to a defined higher value by decreasing the gate potential. This leads to the voltage between the source terminal and the drain terminal being fixed or clamped to a higher value.

In FIG. 2c, the adjusted voltage $V_{ON\_DMOS}$ at the transistor 55 between the source terminal and the drain terminal rises suddenly when the load current $I_L$ exceeds the load current threshold $I_{L\_thres}$. As an alternative hereto, when the load current $I_L$ exceeds the threshold value or the overload threshold value, the transistor 55 could be switched to a source-follow operation, wherein the gate terminal of the semiconductor switch or transistor 55 then is connected or clamped with the source terminal of the transistor.

Figure 2D:
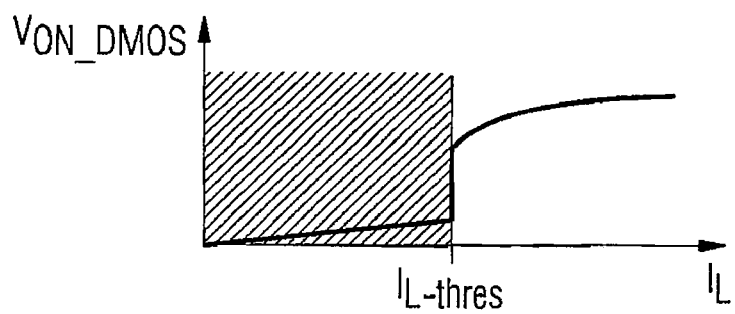

FIG. 2d shows a further alternative for adjusting the transistor 55 upon the load current $I_L$ exceeding the threshold value $I_{L\_thres}$. The values of the load current $I_L$ are plotted on the x-axis, whereas the values of the voltage between the source terminal and the drain terminal of the transistor 55 are plotted on the y-axis. When the load current $I_L$ exceeds the threshold $I_{L\_thres}$, the adjusting circuit 53 regulates the gate potential so that the voltage drop between the source terminal and the drain terminal of the transistor 55 suddenly rises. At a further increase of the load current, the adjusting circuit 53 adjusts the gate potential so that the voltage between the source terminal and the drain terminal of the switching transistor rises continuously with the load current $I_L$.

By the increases in the voltage between the source terminal and the drain terminal shown in FIGS. 2b-d or the shown increase in resistance of the transistor 55, the switching transistor 55 heats up, so that the temperature at the transistor 55 suddenly rises when the load current $I_L$ exceeds the threshold $I_{L\_thres}$. This leads to the fact that the temperature at the temperature-sensing element not shown here at the semiconductor switch suddenly rises, so that it switches off more quickly or within shorter response times at load current peaks.

Figure 3A:
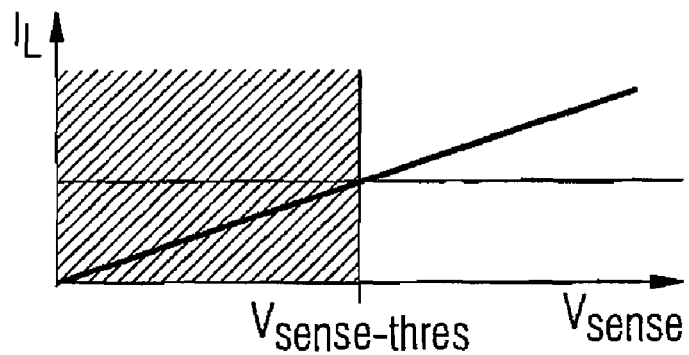
FIG. 3a shows a course of a load current in the protection circuit according to an embodiment of the present invention.
Figure 3B:
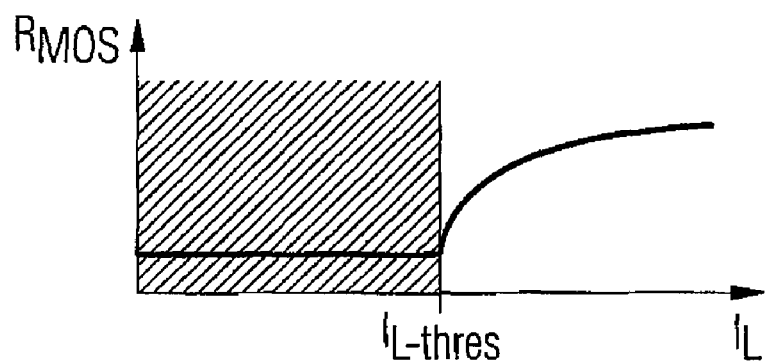
FIG. 3b shows an optional course of a resistance of a DMOS transistor.
Figure 3C:
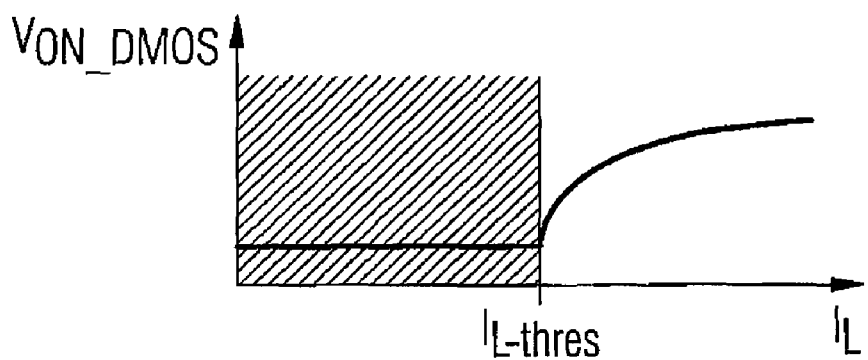
FIG. 3c shows an optional course of the voltage at the DMOS transistor in the protection circuit according to an embodiment of the present invention.

In FIGS. 3a-c, further options for regulating or adjusting the electric behavior of the switching transistor 55 are shown, when the load current $I_L$ exceeds the threshold value $I_{L\_thres}$. FIG. 3a here shows, like FIG. 2a, a dependence of the sense voltage or voltage $V_{sense}$ at the sense resistor 64 on the load current $I_L$. The values of the voltage $V_{sense}$ or voltage at the sense resistor 64 are plotted on the x-axis, whereas the values of the load current $I_L$ are plotted on the y-axis. As already explained above with reference to FIG. 2a, the voltage at the sense resistor 64 is directly proportional to the current $I_L$ through the load resistor. In FIGS. 3a-c, two operating modes each of the protection circuit 51 are shown, a normal operating mode within the gray hatched area and an overload operating mode, when the load current $I_L$ has exceeded the overload current threshold $I_{L\_thres}$, in the white areas of the coordinate system.

FIG. 3b shows another option for adjusting or regulating the resistance between the source terminal and the drain terminal when the load current $I_L$ exceeds the threshold value $I_{L\_thres}$. The values of the load current $I_L$ are plotted on the x-axis in FIG. 3b, whereas the values of the resistance $R_{MOS}$ between the source terminal and the drain terminal of the semiconductor switch 55 are explained on the y-axis. It can be see in FIG. 3b that the resistance $R_{MOS}$ between the source terminal and the drain terminal remains at a fixed value as long as the load current $I_L$ has not exceeded the overload current threshold $I_{L\_thres}$. Moreover, FIG. 3b shows that the adjusting circuit 53 continuously reduces the gate potential, when the load current $I_L$ exceeds the threshold value $I_{L\_thres}$, so that the resistance between the source terminal and the drain terminal of the transistor 55 is increased continuously. As shown in FIG. 2b, a sudden increase in the resistance $R_{MOS}$ is, however, not performed.

FIG. 3c explains a course of the voltage between the drain terminal and the source terminal of the semiconductor switch 55 in dependence on the load current $I_L$. The values of the load current $I_L$ are plotted on the x-axis in FIG. 3c, whereas the values of the adjusted voltage $V_{ON\_DMOS}$ are plotted on the y-axis. When the load current $I_L$ exceeds the threshold or overload current threshold $I_{L\_thres}$, the adjusting circuit 53 regulates the gate potential at the switching transistor 55 so that the value of the voltage $V_{ON\_DMOS}$ between the source terminal and the drain terminal of the switching transistor 55 rises continuously with increasing load current $I_L$. Below the threshold $I_{L\_thres}$, the adjusted value of the voltage between the source terminal and the drain terminal, however, remains at a fixed value.

Increasing the resistance of the transistor 55, i.e. the voltage between the source terminal and the drain terminal at the transistor 55 in turn each leads to a heating of the semiconductor switch 55, as already explained above. The increase in temperature here, however, takes places continuously with increasing load current $I_L$, when the load current $I_L$ has exceeded the threshold value $I_{L\_thres}$.

Figure 4:
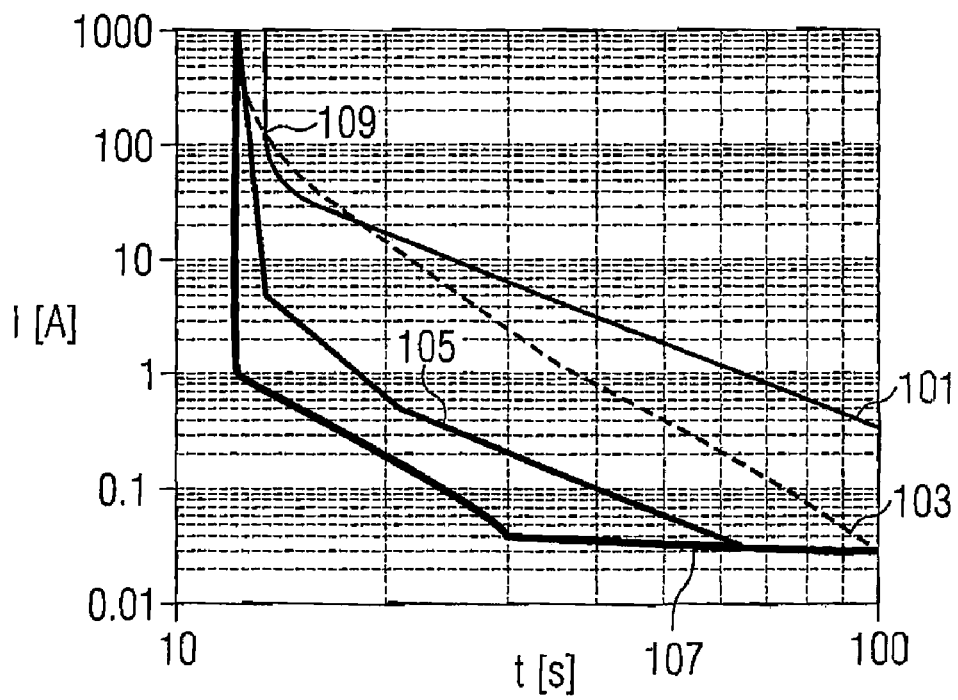
FIG. 4 is a comparison of courses of the response times of a protection circuit according to an embodiment of the present invention with a semiconductor switch with adjustable resistance, of a cable, and of a protection element.

In FIG. 4, the effect of a sudden increase in resistance on a protection behavior in the overload case, which is made quicker by the sudden increase in resistance, in the semiconductor switch 55 is explained. The current through the respective components is illustrated on the x-axis in FIG. 4 in amperes, whereas the response time of the components is plotted on the y-axis in seconds. A curve 101 shows the course of response times for a cable at an ambient temperature of 85° C., and a curve 103 a course of the response times in the semiconductor switch 55 without an increase of the resistance. A curve 105 explains a course of the response times of a protection. The protection considered here is a mini-fuse or a 10-ampere mini-fuse. At the same time, a curve 107 shows the course of the response times of the semiconductor switch 55 at increased resistance. The resistance between the source terminal and the drain terminal is increased by a factor 10 in the semiconductor switch explained in the curve 107. From a comparison of curves 101 and 105, it becomes obvious that the protection element has a shorter response time than the cable over the entire current range, so that the protection can always protect the cable.

But above a critical point 109, the semiconductor switch 55 has a higher response time than the cable at increasing current I, when the resistance between the drain terminal and the source terminal is kept constant. In order to allow for efficient protection of the cable, the resistance between the source terminal and the drain terminal is therefore increased by a factor of about 10 in the protection circuit 51, when the current or load current exceeds the critical point 109. Thus, the response times of the semiconductor switch 55 follow the course of the curve 107, when the current exceeds a predefined threshold value, here the critical point 109.

At increased resistance, the response time of the semiconductor switch is lower than the response time for the cable, so that the semiconductor switch 55 in the protection circuit 51 can protect the cable more efficiently as a result of the increased resistance. The increase in resistance in the semiconductor switch 55 takes place, for example, by means of the protection circuit 51 according to an embodiment shown in FIG. 1.

Figure 5:
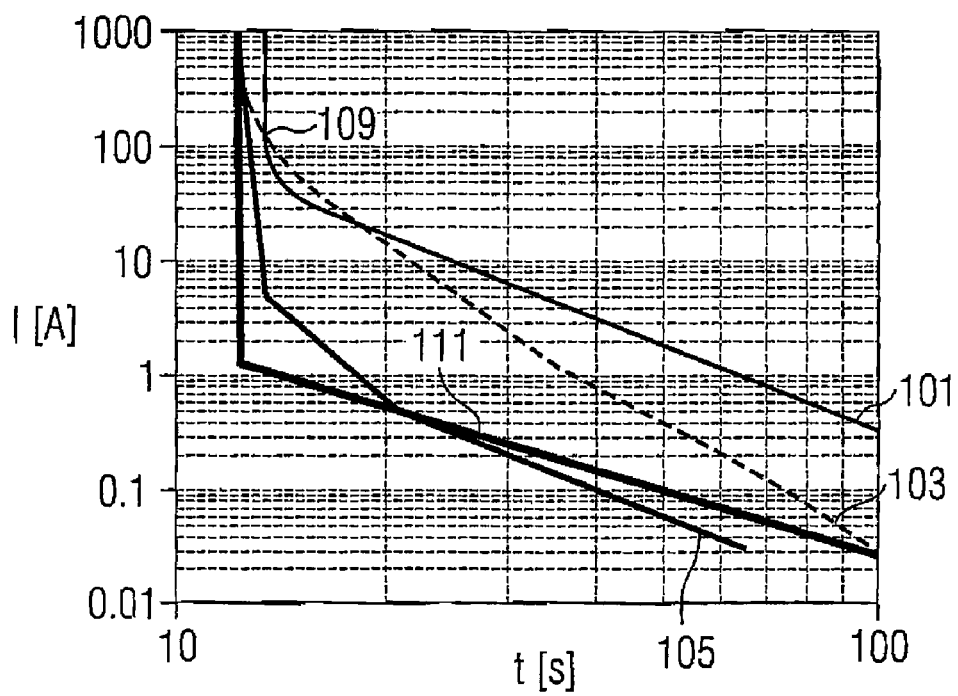
FIG. 5 is a comparison of response times of a protection circuit according to an embodiment of the present invention with the semiconductor switch with adjustable voltage at the semiconductor switch, of a cable, and of a protection element.

FIG. 5 explains the effect of a sudden clamping of the voltage or change of the value of the voltage between the source terminal and the drain terminal of the semiconductor switch 55 or the voltage $V_{ON\_DMOS}$ on a protection behavior in the overload case, which is made quicker by the sudden clamping of the voltage. Different from FIG. 4, instead of the course 107 of the response times of the semiconductor switch 55 in the protection circuit 51 at increased resistance, in FIG. 5 a course 111 of the response times of the semiconductor switch 55 is shown, in which the voltage between the source terminal and the drain terminal $V_{ON}$ is increased suddenly.

Here, the protection circuit 51 is designed so that, at a current below the critical point 109, no clamping of the voltage $V_{ON}$ between the source terminal and the drain terminal is performed, i.e. the course of the response times with reference to the current through the semiconductor switch follows the curve 103. Above the critical point 109, the adjusting circuit 53 adjusts the gate potential so that the voltage between the source terminal and the drain terminal is increased to a constant value. Thus, the response times of the semiconductor switch 55 above the critical point 109 follow the curve 111. The response times in the semiconductor switch 55 above the critical point 109 according to the course 111, i.e. after the increase in the voltage at the semiconductor switch 55, are lower than in the semiconductor switch 55 with the course 103, so that efficient and reliable protection of the cable is enabled again.

Figure 6:
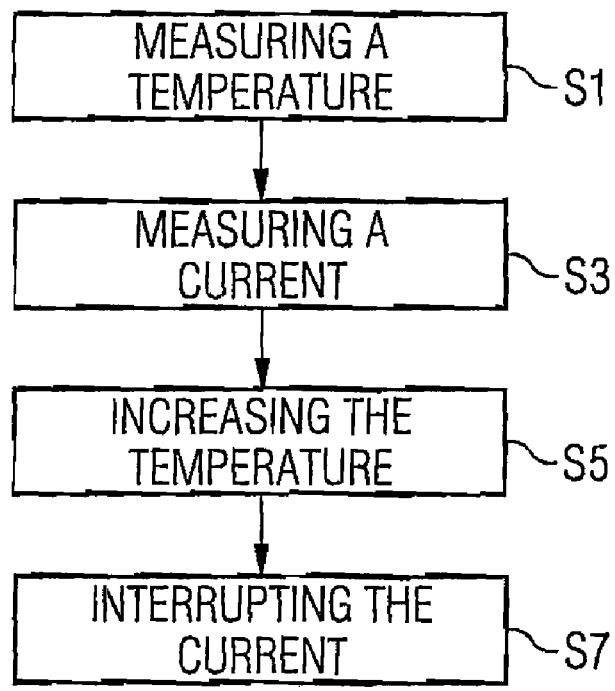
FIG. 6 shows a flow of a method of protecting a load circuit.

In FIG. 6, a method according to an embodiment for protecting a load circuit is explained. In a step S1, at a temperature measurement location typically near the load circuit, a temperature is measured or determined. At the same time, a current-measuring device measures a current through the load circuit in a step S3. When the current through the load circuit exceeds a threshold current value or an overload current threshold, the temperature at the temperature measurement location is increased or a predetermined temperature value decreased in a step S5. When the temperature at the temperature measurement location exceeds the predetermined temperature value, a current through the load circuit is interrupted in a step S7, so that it is protected from increased heating and hence destruction, for example.

Figure 7:
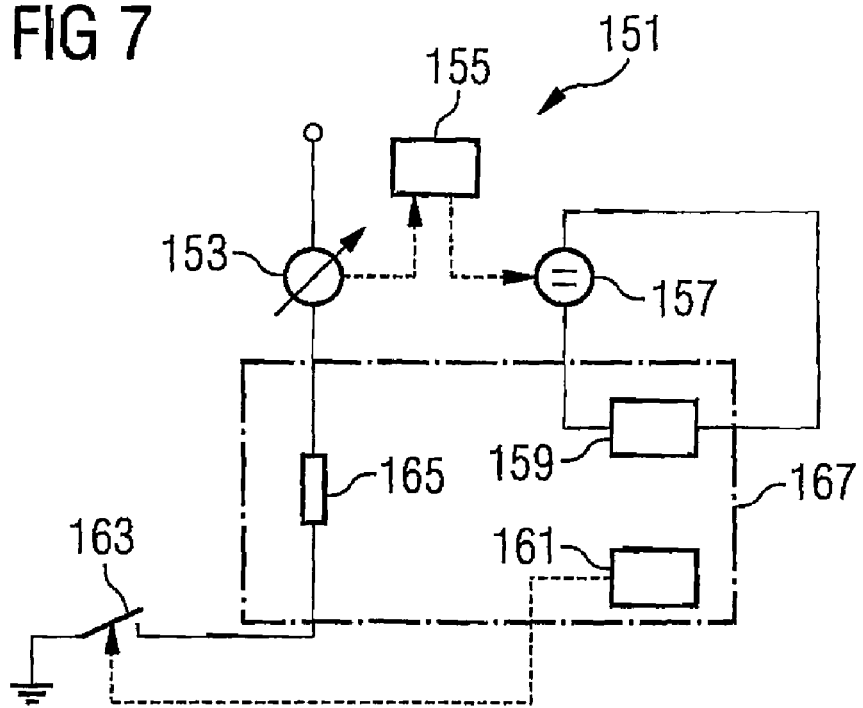
FIG. 7 shows a protection circuit according to a further embodiment of the present invention.

In FIG. 7, a protection circuit 151 according to a further embodiment is shown. The protection circuit 151 comprises a current-measuring device 153, a control means 155, a constant voltage source 157, a heating resistor 159, a triggering means 161, an interruption means 163, and a load element 165. The heating resistor 159, the triggering means 161, and the load element 165 are arranged at a temperature measurement location 167. The temperature measurement location 167 is characterized here by a dashed line.

The current-measuring device 153 is attached to a supply voltage terminal of the protection circuit 151 at a first terminal and connected to a first terminal of the interruption means 163 in electrically conducting manner via the load element 165 at a second terminal. The interruption means 163 is attached to a ground terminal at a second terminal. The heating resistor 159 is attached to the adjustable constant voltage source 157. The triggering means 163 comprises a temperature-sensing element or a temperature sensor and generates a signal when the temperature at the temperature measurement location exceeds a predetermined value. The signal generated by the triggering means 167 is received by the interruption means 163, which thereupon interrupts a connection between the two terminals of the interruption means, and hence a current path through the load element 165.

The current-measuring device 153 determines a current flowing through the load and the interruption means 163. The value of the current is read out by the control means 155. The control means 155 then compares the read-out current value with a threshold value. If the read-out current value exceeds the threshold value, the control means 155 generates a current measurement signal, the value of which depends on the measured current value. The current measurement signal is received by the adjustable constant voltage source 157, which adjusts a voltage at the heating resistor 159 in dependence on the value of the current measurement signal. Thus, the temperature at the temperature measurement location 167 is increased in dependence on the measured current by the current-measuring device 153, when the current exceeds a predetermined threshold value.

The triggering means 161 with a temperature-sensing element determines whether the temperature at the temperature measurement location 167 exceeds a predetermined value. The temperature at the temperature measurement location 167 here depends on the heating of the temperature measurement location by the heating resistor 159 and on the heating of the load element 165. At the same time, heat dissipation from the temperature measurement location to the environment of the temperature measurement location takes place, so that the temperature of the temperature measurement location also depends on the ambient temperature.

If the temperature at the temperature measurement location exceeds the predetermined temperature value, the triggering means 161 triggers interrupting the current flow through the interruption means 163 via the signal generated thereby.

In the protection circuit 151 according to a further embodiment, as it is explained, the temperature is increased via the heating resistor 159, when the current through the interruption means 163 or in a current path between an input terminal and an output terminal of the protection circuit 151 exceeds a predetermined value. This increase of the temperature at the temperature measurement location 167 leads to the triggering means 161 triggering within a shorter response time upon occurrence of a voltage peak or a current peak at the load element 165, which leads to further heating of the temperature measurement location 167. Thus, the protection circuit 151 according to a further embodiment has a shorter response time when the current through the interruption means 163 exceeds a predetermined threshold value.

This leads to more reliable protection of the load element 165 when the current through the interruption means 163 exceeds a certain threshold value. The threshold value may be chosen so that it forms the boundary between a normal operating mode and an overload mode. Advantageously, the protection circuit 151 is also electrically conductive in an overload case, with the interruption means 163 indeed not interrupting the current through the load element 165 immediately, but at the same time reacting to a current or voltage peak at the load element 165 within a shorter response time and interrupting the current through the load element 165. In other words, the load element 165 may still be operated in an overload case, but with the response time of the protection circuit 151 being reduced upon the occurrence of voltage peaks at the load element 165 or current peaks through the load element 165.

In a protection circuit according to an embodiment, the interruption means comprises a n-channel DMOS transistor, but any interruption means, such as n-channel and p-channel MOSFETs, current and temperature-sensing MOSFETs, or possible combinations of these, or mechanical relays, for example, are alternatives hereto. In the protection circuit according to an embodiment, the current measurement is done via the determination of a voltage drop $V_{sense}$ at the sense resistor $R_{sense}$, i.e. by means of a sense circuit, but any circuits for measuring the current through the load or the current between the supply voltage terminal and the ground terminal are alternatives hereto.

Furthermore, the temperature in the protection circuit 51 according to an embodiment is adjusted at the measurement location by an altered electric behavior of the interruption means arranged in the proximity of the temperature measurement location. But any arrangements of the interruption means with reference to the temperature measurement location are alternatives hereto, and also any heating of the temperature measurement location, e.g. via a heating resistor. In the protection circuit 51 according to an embodiment, a control means includes the comparison means 65 and the adjusting circuit 53, to increase a temperature at the temperature measurement location when the voltage drop at the sense resistor exceeds a threshold value. But any designs of a control means changing the electric behavior of the switching transistor in dependence on the voltage drop at the sense resistor, to increase the temperature at the temperature measurement location when the current in the current path or the load current $I_L$ is higher than a threshold value, are alternatives hereto.

In the protection circuit 51 according to an embodiment, the adjusting means 53 increases the temperature at the temperature sensing location when the current through the semiconductor switch 55 exceeds a predetermined threshold value. As an alternative hereto, the temperature threshold or the value of the temperature above which the adjusting circuit 53 adjusts the gate potential so that the semiconductor switch 55 interrupts the connection between the source terminal and the drain terminal could, however, be decreased in the adjusting circuit 53 when the current $I_L$ through the load or the semiconductor switch 55 exceeds a predetermined threshold.

In the protection circuit 51 according to an embodiment, the interruption means or the semiconductor switch 55 is arranged as a high-side switch, but an arrangement of the semiconductor switch 55 as a low-side switch is also possible. In the protection circuit 51 according to an embodiment, an overload current threshold of the semiconductor switch 55 is adjusted, and sufficiently quick response of the semiconductor switch in the fault case, in particular in the overload case, is generated. The functioning is oriented at a temperature-assisted, current-sensing semiconductor switch, which may for example be implemented in self-protecting, smart semiconductor switches. The functioning has been shown exemplarily at a smart high-side switch based on an n-channel MOSFET. But it could equally be applied to smart low-side switches, MOSFETs with current sense functionality and a temperature sensor, external drivers, or protection wirings.

Alternatively, an employment of the protection circuit 51 according to an embodiment in bridges and other possible circuit arrangements of integrated smart or discretely constructed, protected semiconductor switches would also be possible. In FIGS. 4 and 5, optional functionalities of the protection circuit 51 according to an embodiment are explained, which when the current exceeds a critical value or critical point 109 changes a resistance of the switching transistor or adjusts a value of the voltage at the switching transistor 55 so that the protection circuit has shorter reaction times or quicker response behavior. The critical point 109 is preferably set so that the reaction time of the protection circuit 51 with the semiconductor switch 55 at the critical point 109 is close to the reaction time of the cable, but still lower than the reaction time of the cable. But any settings or adjustments of the critical point 109 are alternatives hereto.

In the optional design of the protection circuit 51 according to an embodiment explained in FIG. 2d, the voltage at the semiconductor switch 51, when the load current exceeds the overload current threshold $I_{L\_thres}$, is at first increased suddenly and then increased steadily with further increasing load current $I_L$. The adjusting circuit 53 may be formed as an operational amplifier circuit, for example, which regulates the gate potential in the manner shown. As an alternative hereto, the resistance between the source terminal and the drain terminal of the transistor 55 or the resistance of the semiconductor switch 55 could also be at first increased suddenly and then increased further with increasing load current $I_L$, when the load current exceeds the overload current threshold $I_{L\_thres}$. Here, the adjusting circuit 53 may also be formed as an operational amplifier circuit changing the resistance of the semiconductor switch 55 by corresponding adjustment of the gate potential.

The protection circuit 51 according to an embodiment is preferably implemented on a chip, but could also be implemented on several chips, which may then be arranged in a single package in a multi-chip module, for example. Preferably, the temperature measurement location then is in the package or on the package wall. But arrangements in which the elements of the protection circuit 51 according to an embodiment are not accommodated in a single package are also alternatives hereto.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A protection circuit, comprising:
an interrupter formed to interrupt a current path between a protection circuit input and a protection circuit output if a sensed temperature at a temperature measurement location exceeds a predetermined temperature; and
a controller formed to generate a control signal depending on a current in the current path, wherein the protection circuit is formed to increase, independent of the sensed temperature, the temperature at the temperature measurement location or decrease the predetermined temperature, when the control signal indicates that the current in the current path is higher than a threshold value current.

2. The protection circuit of claim 1, formed to change, when the control signal indicates that the current in the current path is higher than a threshold value current, an electric behavior of the protection circuit to increase a temperature at the temperature measurement location.

3. The protection circuit of claim 1, wherein the controller is formed to increase a voltage drop taking place at an electric device of the protection circuit when the current in the current path is higher than the threshold value current, wherein the electric device is arranged in the proximity of the temperature measurement location so that a power at the electric device increases the temperature at the temperature measurement location.

4. The protection circuit of claim 1, wherein the interrupter and the controller are arranged in a package, and the temperature measurement location is arranged on the package or within the package.

5. The protection circuit of claim 1, comprising a temperature sensor arranged in the proximity of the temperature measurement location to determine the temperature at the temperature measurement location, and formed to provide a temperature sensor signal, wherein the interrupter is formed to receive the temperature sensor signal and interrupt the current path depending on the temperature sensor signal.

6. The protection circuit of claim 1, wherein the interrupter is formed as a transistor, and wherein the controller is formed to adjust a signal at a control input of the transistor to increase a resistance of the transistor or to increase a voltage drop between two transistor terminals.

7. The protection circuit of claim 1, wherein the controller includes a sense resistor and is formed to determine the current in the current path via a voltage, which is proportional to a measurement current, in a sense path at the sense resistor.

8. The protection circuit of claim 1, which is formed to suddenly increase the temperature at the temperature measurement location when the control signal indicates that the current in the current path is higher than the threshold value current.

9. The protection circuit of claim 8, which is formed to at first increase the temperature at the temperature measurement location suddenly and then continuously increase the temperature of the temperature measurement location further depending on a difference of the current in the current path and the threshold value current, when the control signal indicates that the current in the current path is higher than the threshold value current.

10. The protection circuit of claim 1, which is formed to continuously increase the temperature at the temperature measurement location depending on a difference between the current in the current path and the threshold value current when the control signal indicates that the current in the current path is higher than threshold value current, and no longer increase the temperature when the current is lower than the threshold value current.

11. The protection circuit of claim 1, wherein a resistor is connected between the protection circuit input and the protection circuit output, wherein the controller is formed to increase a value of the resistor when the current in the current path is higher than the threshold value current, and wherein the resistor is arranged in the proximity of the temperature measurement location so that a power dropping at the same increases the temperature at the temperature measurement location.

12. A protection circuit, comprising:
interrupting means for interrupting a current path between a protection circuit input and a protection circuit output if a sensed temperature at a temperature measurement location exceeds a predetermined temperature; and
control means for generating a control signal depending on a current in the current path, wherein the protection circuit is formed to increase, independent of the sensed temperature, the temperature at the temperature measurement location or decrease the predetermined temperature, when the control signal indicates that the current in the current path is higher than a threshold value current.

13. The protection circuit of claim 12, formed to change, when the control signal indicates that the current in the current path is higher than a threshold value current, an electric behavior of the protection circuit to increase a temperature at the temperature measurement location.

14. The protection circuit of claim 12, wherein the control means increase a voltage drop taking place at an electric device of the protection circuit when the current in the current path is higher than the threshold value current, wherein the electric device is arranged in the proximity of the temperature measurement location so that a power at the electric device increases the temperature at the temperature measurement location.

15. The protection circuit of claim 12, wherein the interrupt means and the control means are arranged in a package, and the temperature measurement location is arranged on the package or within the package.

16. The protection circuit of claim 12, comprising a temperature sensor arranged in the proximity of the temperature measurement location to determine the temperature at the temperature measurement location, and formed to provide a temperature sensor signal, wherein the interrupt means receive the temperature sensor signal and interrupt the current path depending on the temperature sensor signal.

17. The protection circuit of claim 12, wherein the interrupt means is formed as a transistor, and wherein the control means is formed to adjust a signal at a control input of the transistor to increase a resistance of the transistor or to increase a voltage drop between two transistor terminals.

18. The protection circuit of claim 12, wherein the control means comprise a sense resistor and determine the current in the current path via a voltage, which is proportional to a measurement current, in a sense path at the sense resistor.

19. The protection circuit of claim 12, wherein the protection circuit suddenly increases the temperature at the temperature measurement location when the control signal indicates that the current in the current path is higher than the threshold value current.

20. The protection circuit of claim 19, wherein the protection circuit at first increases the temperature at the temperature measurement location suddenly and then continuously increases the temperature of the temperature measurement location further depending on a difference of the current in the current path and the threshold value current, when the control signal indicates that the current in the current path is higher than the threshold value current.

21. The protection circuit of claim 12, wherein the protection circuit continuously increases the temperature at the temperature measurement location depending on a difference between the current in the current path and the threshold value current when the control signal indicates that the current in the current path is higher than threshold value current, and no longer increases the temperature when the current is lower than the threshold value current.

22. The protection circuit of claim 12, wherein a resistor is connected between the protection circuit input and the protection circuit output, wherein the control means increase a value of the resistor when the current in the current path is higher than the threshold value current, and wherein the resistor is arranged in the proximity of the temperature measurement location so that a power dropping at the same increases the temperature at the temperature measurement location.

* * * * *